US007952908B2

(12) United States Patent  
Park

(10) Patent No.: US 7,952,908 B2  
(45) Date of Patent: May 31, 2011

(54) APPARATUS AND METHOD FOR SENSING MULTI-LEVEL CELL DATA

(75) Inventor: Kyoung-Wook Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 205 days.

(21) Appl. No.: 12/436,406

(22) Filed: May 6, 2009

(65) Prior Publication Data

US 2010/0165718 A1 Jul. 1, 2010

(30) Foreign Application Priority Data

Dec. 31, 2008 (KR) ........................ 10-2008-0138588

(51) Int. Cl.
*G11C 11/00* (2006.01)
*G11C 11/34* (2006.01)

(52) U.S. Cl. .................. 365/148; 365/163; 365/185.03; 365/185.21; 365/189.07; 365/203; 365/205

(58) Field of Classification Search .................. 365/148, 365/163, 185.03, 185.21, 189.05, 189.07, 365/203, 205, 207, 208

See application file for complete search history.

(56) References Cited

U.S. PATENT DOCUMENTS

| 5,973,957 | A * | 10/1999 | Tedrow ..................... 365/185.03 |
| 6,014,327 | A * | 1/2000 | Banks ........................ 365/185.03 |
| 6,069,821 | A * | 5/2000 | Jun et al. .................. 365/185.03 |
| 6,169,689 | B1 * | 1/2001 | Naji ............................... 365/173 |
| 6,636,433 | B2 * | 10/2003 | Tanikawa ....................... 365/148 |
| 6,985,383 | B2 * | 1/2006 | Tang et al. ..................... 365/148 |
| 7,075,843 | B2 * | 7/2006 | Zheng et al. .................. 365/205 |
| 7,180,767 | B2 * | 2/2007 | Chen et al. ..................... 365/148 |
| 7,304,881 | B2 * | 12/2007 | Rodriguez et al. ............ 365/205 |
| 7,515,461 | B2 * | 4/2009 | Happ et al. ..................... 365/163 |
| 7,518,934 | B2 * | 4/2009 | Bedeschi et al. .............. 365/163 |
| 7,548,467 | B2 * | 6/2009 | Kim et al. ...................... 365/148 |
| 7,623,401 | B2 * | 11/2009 | Philipp et al. ................. 365/163 |
| 7,639,526 | B2 * | 12/2009 | Pellizzer et al. .............. 365/163 |
| 7,724,564 | B2 * | 5/2010 | Taylor et al. .................. 365/148 |
| 7,787,282 | B2 * | 8/2010 | Ramani et al. ................. 365/148 |
| 7,791,934 | B2 * | 9/2010 | Kang et al. .................... 365/163 |
| 7,835,173 | B2 * | 11/2010 | Ma et al. ........................ 365/148 |
| 7,869,253 | B2 * | 1/2011 | Liaw et al. ..................... 365/148 |

FOREIGN PATENT DOCUMENTS

| KR | 1020000061557 | 10/2000 |
| KR | 1020040075033 A | 8/2004 |
| KR | 1020080097126 | 11/2008 |

OTHER PUBLICATIONS

Notice of Preliminary Rejection issued from Korean Intellectual Property Office on Jul. 28, 2010.

* cited by examiner

*Primary Examiner* — Trong Phan  
(74) *Attorney, Agent, or Firm* — IP & T Group LLP

(57) ABSTRACT

A multi-level sensing apparatus of the non-volatile memory includes a first sense amplifier configured to compare a first reference voltage with a read data of a bit line and amplify a comparison result to generate a first output; a reference voltage selector configured to select one of a second reference voltage and a third reference voltage as a fourth reference voltage according to a logic level of the first output; a second sense amplifier configured to compare the fourth reference voltage with the read data of the bit line and amplify a comparison result to generate a second output; and a decoder configured to decode the first and second outputs to output a sensing data.

33 Claims, 3 Drawing Sheets

APPARATUS AND METHOD FOR SENSING MULTI-LEVEL CELL DATA

CROSS-REFERENCE TO RELATED APPLICATIONS

The present invention claims priority of Korean patent application number 10-2008-0138588, filed on Dec. 31, 2008, which is incorporated by reference in its entirety.

BACKGROUND OF THE INVENTION

The present invention relates to a semiconductor memory, and more particularly, to a technology for sensing data having a multi-level in a non-volatile memory such as a phase change memory.

Recently, a phase change random access memory (PRAM) is drawing attention as a next generation semiconductor memory and is implemented using a phase change material.

The PRAM includes a cell storing data using a germanium antimony telluride (Ge2Sb2Te5), referred to as GST hereafter, which is one of phase change materials. The GST as a phase change material changes to crystalline or amorphous state according to the change of temperature and the amount of current, and the PRAM stores data "0" or "1" according to the phase change.

Upon a write operation, when a current flows on the GST, the GST changes to the crystalline or amorphous state. The phase change of the GST occurs due to the Joule heating generated by a current applied to a cell.

Upon the write operation, when the GST is heated to above its melting temperature by a write current IWRITE and then is rapidly cooled, the phase of the GST changes to the amorphous state, and stores data "H" corresponding to the phase change. The amorphous state is referred to as a reset state.

Upon the write operation, when the GST is heated to above the crystallization temperature by the write current IWRITE and then is cooled after being maintained for a certain period, the phase of the GST changes to the crystalline state and stores data "L" corresponding to the phase change. The crystalline state is referred to as a set state.

As described above, although the PRAM stores a single data having one of two states, that is, high resistance and low resistance, the PRAM can also have four-level resistance distribution by precisely controlling the resistance distribution in the write operation.

In the non-volatile memory such as the phase change memory described above, technologies for reading or writing multi-level data have been developed in order to store much more data using restricted resources.

In order to read or write multi-level data, a method for sensing the multi-level of data is required. In most cases, different levels of reference voltages and an apparatus including sense amplifiers with respect to each reference voltage are used to sense the multi-level data.

Specifically, the sensing of four-level data requires three reference voltages and three sense amplifiers. That is, the multi-level sensing apparatus for sensing the four-level data determines which one of the four levels data read through outputs of the three sense amplifiers should be read.

However, the semiconductor chip has been developed to have higher integration density in a restricted area. To meet such a trend, the multi-level sensing apparatus is required to have higher integration density.

SUMMARY OF THE INVENTION

Embodiments of the present invention are directed to providing an apparatus and method that can sense multi-level data using fewer sense amplifiers.

Also, embodiments of the present invention are directed to providing an apparatus and method that is capable of sensing four-level data using two sense amplifiers.

In accordance with an aspect of the present invention, there is provided a multi-level sensing apparatus of a non-volatile memory, including: a first sense amplifier configured to compare a first reference voltage with a read data of a bit line and amplify a comparison result to generate a first output; a reference voltage selector configured to select one of a second reference voltage and a third reference voltage as a fourth reference voltage according to a logic level of the first output; a second sense amplifier configured to compare the fourth reference voltage with the read data of the bit line and amplify a comparison result to generate a second output; and a decoder configured to decode the first and second outputs to output a sensing data.

In accordance with another embodiment of the present invention, there is provided a multi-level sensing method of a non-volatile memory, including: performing a first comparison and amplification operation on a first reference voltage and a read data of a bit line to generate a first output; selecting one of a second reference voltage and a third reference voltage as a fourth reference voltage according to a logic level of the first output; performing a second comparison and amplification operation on the fourth reference voltage and the read data of the bit line to generate a second output; and decoding the first and second outputs to output a sensing data.

In accordance with another embodiment of the present invention, there is provided a sensing apparatus of a phase change memory, the sensing apparatus including: a data driver configured to be selectively turned on for connection to a bit line of the phase change memory and drive a read data of the bit line in the turned-on state; a first sense amplifier configured to compare the read data transferred through the bit line with a first reference voltage and amplify a comparison result to generate a first output, after the data driver is turned on; a reference voltage selector configured to select one of a second reference voltage and a third reference voltage as a fourth reference voltage according to a logic level of the first output; a second sense amplifier configured to compare the sensing voltage, the fourth reference voltage, and the read data of the bit line and amplify a comparison result to generate a second output; and a decoder configured to decode the first and second outputs to output a sensing data.

The data driver may include a bit line selecting unit configured to be switched to transfer the read data loaded on the bit line; a bit line driving unit configured to be switched to drive a sensing voltage; and a precharging unit disposed between the bit line selecting unit and the bit line driving unit, and configured to precharge an output terminal of the bit line driving unit to the sensing voltage in an interval between the turning-on of the bit line selecting unit and the turning-on of the bit line driving unit.

The first and second sense amplifiers may be configured using latch-type differential amplifiers. The second sense amplifier is enabled after the first sense amplifier is enabled. The first sense amplifier may maintain the first output until the second output of the second sense amplifier is generated. A level of the first reference voltage may be between a level of the second reference voltage and a level of the third reference voltage. The reference voltage selector may include a first switching configured to switch the second reference voltage; and a second switching element configured to switch the third reference voltage, the first and second switching elements sharing an output terminal, being turned on or turn off by the first output, and being alternately turned on or turned off. The first and second switching elements may be configured using transmission gates. The reference voltage selector may further include a stabilizing unit comprising a precharging unit configured to precharge the shared output terminal of the first and second switching elements, and a capacitor for a voltage stabilization of the shared output terminal of the first and second switching elements, which are connected in parallel to the shared output terminal of the first and second switching elements.

In accordance with another embodiment of the present invention, there is provided a sensing method of a phase change memory, including: selecting and precharging a bit line; driving data of the bit line after the precharging is completed; enabling a first sense amplifier to performing a comparison and amplification operation on a first reference voltage and the read data of the bit line to generate a first output; selecting one of a second reference voltage and a third reference voltage as a fourth reference voltage according to a logic level of the first output; enabling a second sense amplifier to perform a comparison and amplification operation on the reference voltage and the read data loaded on the bit line to generate a second output; and decoding the first and second outputs to output a sensing data.

The second sense amplifier may be enabled at a time when the first sense amplifier is enabled. The sensing method of a phase change memory may further include a step for precharging the output terminal of the fourth reference voltage before the fourth reference voltage is selected.

DESCRIPTION OF SPECIFIC EMBODIMENTS

Other objects and advantages of the present invention can be understood by the following description, and become apparent with reference to the embodiments of the present invention.

Embodiments of the present invention disclose a technology for sensing multi-level data, and exemplify an apparatus and method for sensing four-level read data. However, it will be understood by a person skilled in the art that the embodiments set forth herein can be realized with respect to much more bits without being limited to an application of four-level read data.

Figure 1:
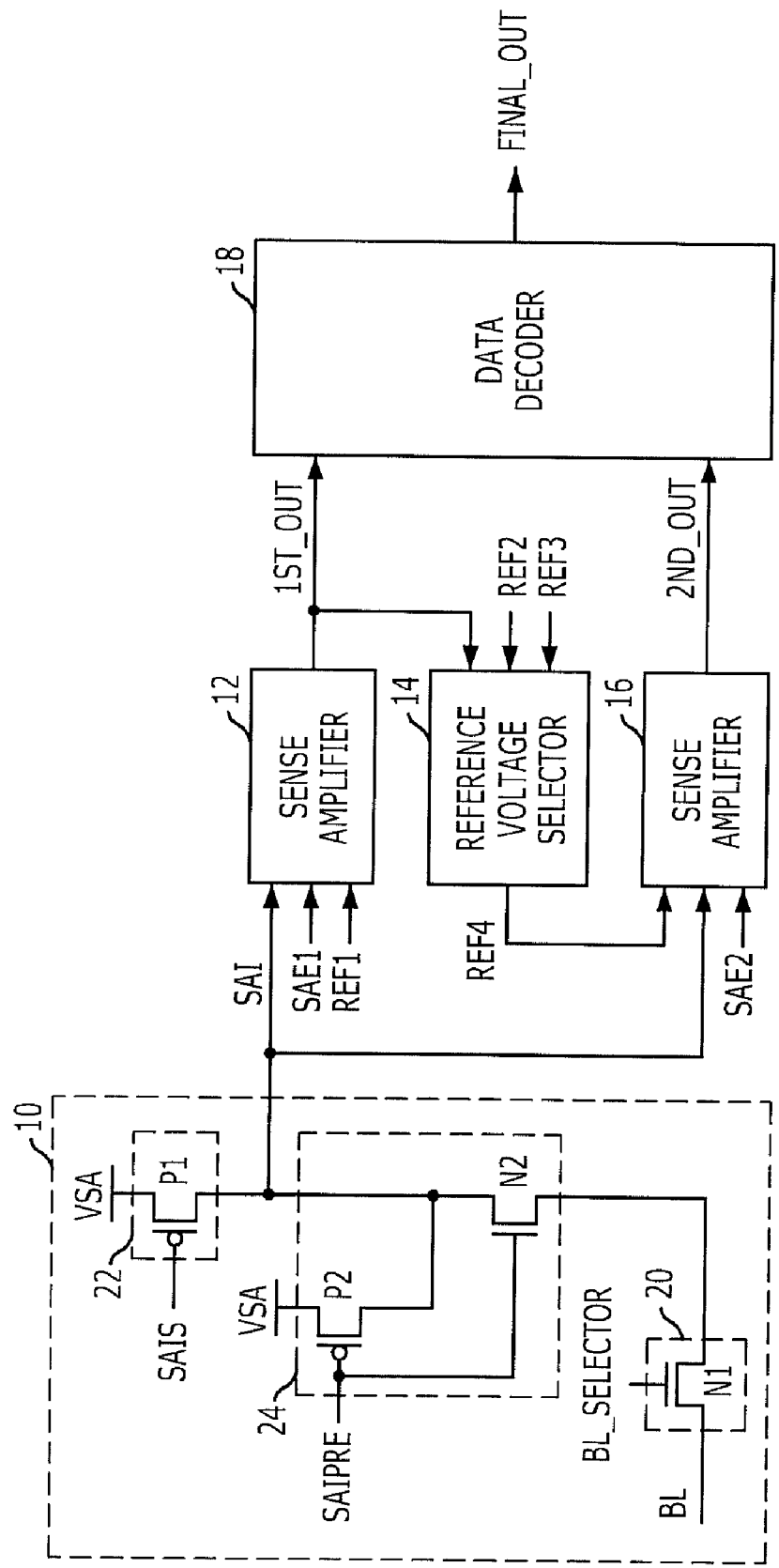
FIG. 1 is a circuit diagram illustrating a multi-level sensing apparatus of a phase change memory in accordance with an embodiment of the present invention.

Referring to FIG. 1, a multi-level sensing apparatus of a phase change memory includes a data driver 10, a sense amplifier 12, a reference voltage selector 14, a sense amplifier 16, and a data decoder 18. The data driver 10 drives a read data of a bit line BL in the phase change memory. The sense amplifier 12 outputs a first output 1ST_OUT by sensing a first reference voltage REF1. The reference voltage selector 14 selects one of a second reference voltage REF2 and a third reference voltage REF3 according to the first reference voltage REF1 to output a fourth reference voltage REF4. The sense amplifier 16 senses the data driven by the data driver 10 by using the fourth reference voltage REF4 to output a second output 2ND_OUT. The data decoder 18 decodes the first and second outputs 1ST_OUT and 2ND_OUT of the sense amplifier 12 and 16 to output a sensing data FINAL_OUT.

In this case, the data driver 10 includes a bit line selecting unit 20, a bit line driving unit 22, and a bit line precharging unit 24. The bit line selecting unit 20 may include a switching element such as an NMOS transistor N1 having a gate receiving a bit line selection signal BL_SELECTOR. The bit line driving unit 22 may include a switching element such as a PMOS transistor P1 having a gate receiving a sensing current supply start signal SAIS. The bit line precharging unit 24 may include a switching element such as an NMOS transistor N2 configured to switch between the bit line selecting unit 20 and the bit line driving unit 22, and a switching element such as a PMOS transistor P2 configured to switch to supply a sensing voltage VSA to a connection node between the NMOS transistor N2 and the PMOS transistor P1. In this case, a sense amp precharge control signal SAIPRE is applied to the gates of the NMOS transistor N2 and PMOS transistor P2.

Figure 2:
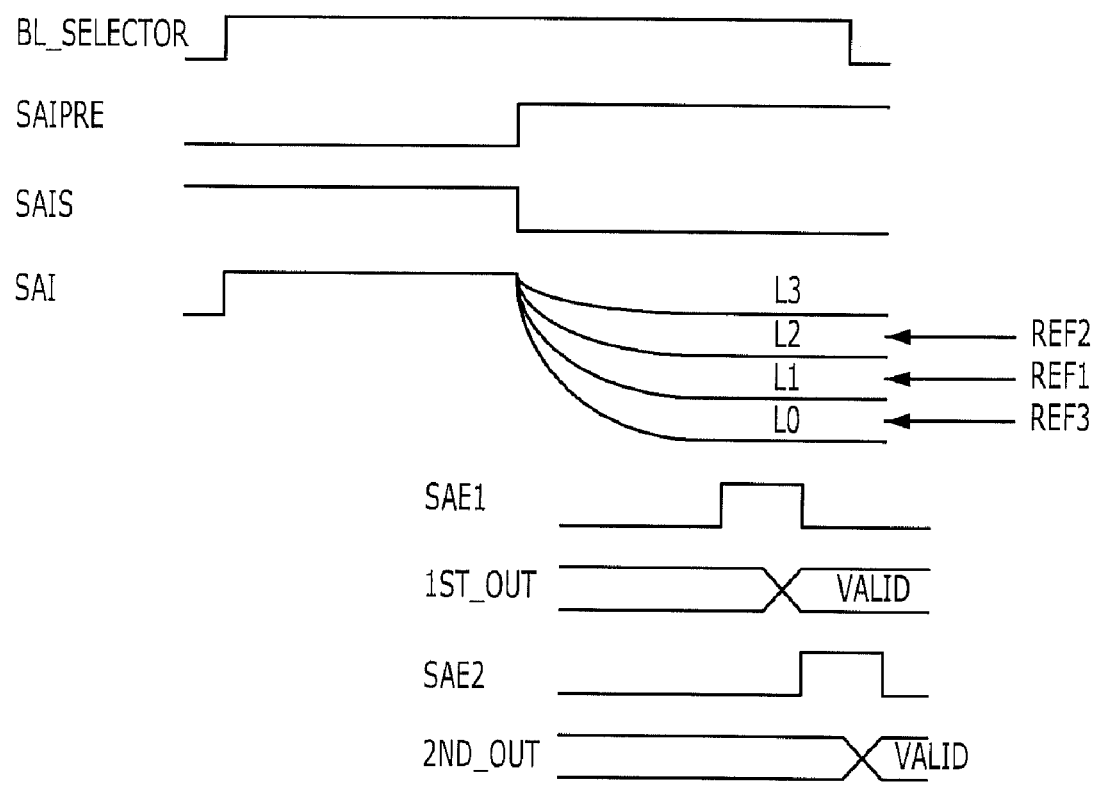
FIG. 2 is a waveform diagram of signals used in the embodiment of FIG. 1.

Hereafter, the operation of the data driver 10 will be described with reference to a waveform diagram of FIG. 2.

First, the bit line selection signal BL_SELECTOR is activated to a logic high level, and the sense amp precharge control signal SAIPRE is maintained at a logic low level. Accordingly, the NMOS transistor N1 is turned on and the NMOS transistor N2 is turned off, so that the bit line BL is not connected to the sense amplifiers 12 and 16. Also, since the PMOS transistor P2 is turned on, the sensing voltage VSA for a precharge is applied to a node shared by the PMOS transistor P1 and the sense amplifiers 12 and 16. In this case, the PMOS transistor P1 is turned off because the sensing current supply start signal SAIS of a logic high level is applied thereto.

Then, in a state that the bit line selection signal BL_SELECTOR is maintained at a logic high level, the sense amp precharge control signal SAIPRE changes to a logic high level, and the sensing current supply start signal SAIS changes to a logic low level. Accordingly, the PMOS transistor P2 is turned on, and the PMOS transistor P1 and the NMOS transistor N2 are turned on. That is, the precharging by the turn-on of the PMOS transistor P2 is completed, and read data of the bit line BL is transferred to the sense amplifiers 12 and 16. The sensing voltage VSA is supplied by the PMOS transistor P1.

As described above, when the read data is transferred, the current supplied to the sense amplifiers 12 and 16 varies according to levels of the written data.

The sense amplifiers 12 and 16 may be configured using typical latch-type differential amplifiers (not shown), and detail description thereof will be omitted herein.

The sense amplifiers 12 and 16 are enabled by different enable signals SAE1 and SAE2. As can be seen from FIG. 2, the sense amplifier 12 is first enabled by the enable signal SAE1, and then sense amplifier 16 is enabled by the enable signal SAE2 after the sensing completion of the sense amplifier 12. Since the sense amplifier 12 is configured using the latch-type differential amplifier, the output of the sense amplifier 16 may be maintained until being effectively recognized in the decoder 18.

First, the sense amplifier 12 compares a voltage SAI derived from the read data with the reference voltage REF1 in response to the enable signal SAE1, and outputs the comparison result as the first output 1ST_OUT. In this case, when the voltage SAI derived from the read data is higher than the reference voltage REF1, the first output 1ST_OUT is outputted at a logic high level; otherwise, the first output 1ST_OUT is outputted at a logic low level.

The first output 1ST_OUT from the sense amplifier 12 is applied to the reference voltage selector 14. The reference voltage selector 14 selects the second voltage REF2 or the third reference voltage REF3 as the fourth reference voltage REF4 according to the level of the first output 1ST_OUT. In this case, the second reference voltage REF2 has a higher level than the first reference voltage REF1, and the third reference voltage REF3 has a lower level than the first reference voltage REF1.

Figure 3:
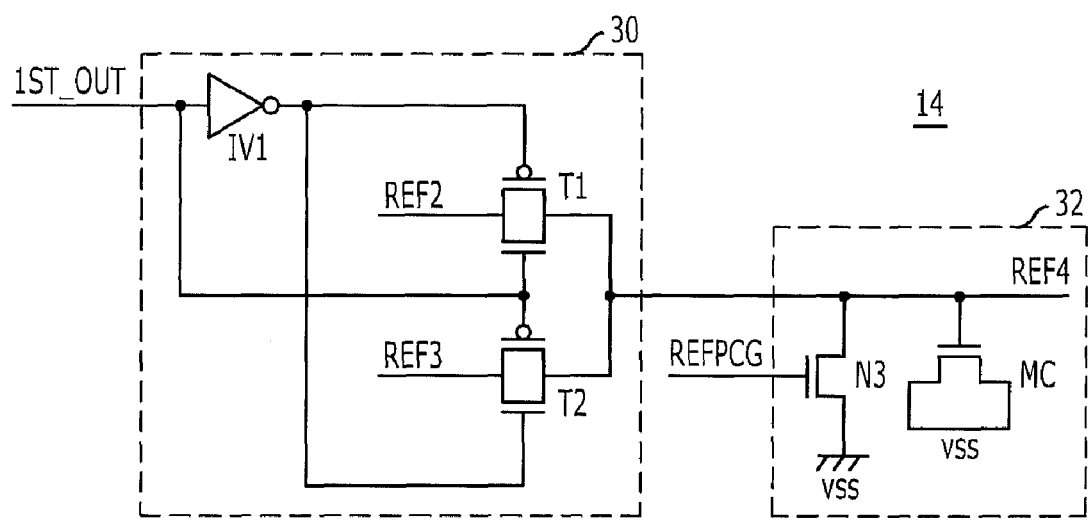
FIG. 3 is a circuit diagram illustrating a reference voltage selection unit.

In order to perform the above selection, the reference voltage selector 16 may have a configuration illustrated in FIG. 3.

That is, the reference voltage selector 14 includes a selecting unit 30 and a stabilizing unit 32.

The selecting unit 30 includes an inverter IV1 and two transmission gates T1 and T2 acting as switching elements. The transmission gate T1 switching the second reference voltage REF2 and the transmission gate T2 switching the third reference voltage REF3 share an output terminal, and are turned on or turned off by the first output 1ST_OUT. The transmission gates T1 and T2 are alternately turned on or turned off because the signal polarity of the first output 1ST_OUT transferred to the transmission gate T1 is inverted through the inverter IV1.

The stabilizing unit 32 includes an NMOS transistor N3 and an NMOS capacitor MC, which are connected in parallel to the output terminal shared by the transmission gates T1 and T2. The NMOS transistor N3 is switched for a precharge for the initialization of the output terminal shared by the transmission gates T1 and T2, and transfers a ground voltage VSS in response to a reference voltage precharge control signal REFPCG. The NMOS capacitor MC stabilizes the level of the fourth reference voltage REF4 to be outputted.

When the first output 1ST_OUT having a logic high level is applied to the reference voltage selector 14 configured as described above, the second reference voltage REF2 is outputted as the fourth reference voltage REF4. When the first output 1ST_OUT having a lower level is applied, the third reference voltage REF3 is outputted as the fourth reference voltage REF4.

On the other hand, the sense amplifier 16 compares the voltage SAI derived from the read data with the fourth reference voltage REF4 outputted from the reference voltage selector 16 to amplify and output the comparison result as the second output 2ND_OUT. In this case, when the voltage SAI derived from the read data is higher than the fourth reference voltage REF4, the second output 2ND_OUT is outputted at a high level; otherwise, the second output 2ND_OUT is outputted at a low level.

The first and second outputs 1ST_OUT and 2ND_OUT may have the levels listed in Table 1, and the sensing data may have the following values according to the levels of the first and second outputs 1ST_OUT and 2ND_OUT.

TABLE 1

| 1ST_OUT | 2ND_OUT | Sensing data (FINAL_OUT) |
| --- | --- | --- |
| 0 | 0 | L0 |
| 0 | 1 | L1 |
| 1 | 0 | L2 |
| 1 | 1 | L3 |

In accordance with the embodiments of the present invention, the chip density of the non-volatile memory can be improved by using fewer sense amplifiers to sense multi-level data such as four-level data, without the sense amplifiers for separate reference voltages. Accordingly, the manufacturing cost of the non-volatile memory can be reduced.

While the present invention has been described with respect to the specific embodiments, it will be apparent to those skilled in the art that various changes and modifications may be made without departing from the spirit and scope of the invention as defined in the following claims.

What is claimed is:

1. A multi-level sensing apparatus of a non-volatile memory, the multi-level sensing apparatus comprising:
    a first sense amplifier configured to compare a first reference voltage with a read data of a bit line and amplify a comparison result to generate a first output;
    a reference voltage selector configured to select one of a second reference voltage and a third reference voltage as a fourth reference voltage according to a logic level of the first output;
    a second sense amplifier configured to compare the fourth reference voltage with the read data of the bit line and amplify a comparison result to generate a second output; and
    a decoder configured to decode the first and second outputs to output a sensing data.

2. The multi-level sensing apparatus of claim 1, wherein the first and second sense amplifiers comprise latch-type differential amplifiers.

3. The multi-level sensing apparatus of claim 1, wherein the second sense amplifier is enabled after the first sense amplifier is enabled.

4. The multi-level sensing apparatus of claim 1, wherein the first sense amplifier maintains the first output until the second sense amplifier generates the second output.

5. The multi-level sensing apparatus of claim 1, wherein a level of the first reference voltage is between a level of the second reference voltage and a level of the third reference voltage.

6. The multi-level sensing apparatus of claim 1, wherein the reference voltage selector comprises:
    a first switching element configured to selectively provide the second reference voltage; and
    a second switching element configured to selectively provide the third reference voltage,
    wherein the first and second switching elements sharing an output terminal are alternatively turned on or turned off by the first output.

7. The multi-level sensing apparatus of claim 6, wherein the first and second switching elements comprise transmission gates.

8. The multi-level sensing apparatus of claim 6, wherein the reference voltage selector further comprises a stabilizing unit configured to precharge the shared output terminal of the first and second switching elements.

9. The multi-level sensing apparatus of claim 6, wherein the reference voltage selector further comprises a stabilizing unit comprising a capacitor for a voltage stabilization of the shared output terminal of the first and second switching elements.

10. The multi-level sensing apparatus of claim 6, wherein the reference voltage selector further comprises a stabilizing unit comprising a precharging unit configured to precharge the shared output terminal of the first and second switching elements, and a capacitor for a voltage stabilization of the shared output terminal of the first and second switching elements, the precharge unit and the capacitor being coupled in parallel to the shared output terminal of the first and second switching elements.

11. A multi-level sensing method of a non-volatile memory, the multi-level sensing method comprising:
    performing a first comparison and amplification operation on a first reference voltage and a read data of a bit line to generate a first output;

selecting one of a second reference voltage and a third reference voltage as a fourth reference voltage according to a logic level of the first output;

performing a second comparison and amplification operation on the fourth reference voltage and the read data of the bit line to generate a second output; and decoding the first and second outputs to output a sensing data.

12. The multi-level sensing method of claim 11, wherein the second comparison and amplification operation is performed after the first comparison and amplification operation.

13. The multi-level sensing method of claim 11, wherein the first output is maintained until the second output is generated.

14. The multi-level sensing method of claim 11, wherein a level of the first reference voltage is between a level of the second reference voltage and a third reference voltage.

15. The multi-level sensing method of claim 11, further comprising precharging an output terminal for the fourth reference voltage before the fourth reference voltage is selected.

16. A sensing apparatus of a phase change memory, the sensing apparatus comprising:

a data driver configured to be selectively turned on for connection to a bit line of the phase change memory and drive a read data of the bit line in the turned-on state;

a first sense amplifier configured to compare the read data transferred through the bit line with a first reference voltage and amplify a comparison result to generate a first output, after the data driver is turned on;

a reference voltage selector configured to select one of a second reference voltage and a third reference voltage as a fourth reference voltage according to a logic level of the first output;

a second sense amplifier configured to compare the sensing voltage, the fourth reference voltage, and the read data of the bit line and amplify a comparison result to generate a second output; and a decoder configured to decode the first and second outputs to output a sensing data.

17. The sensing apparatus of claim 16, wherein the data driver comprises:

a bit line selecting unit configured to selectively transfer the read data loaded on the bit line;

a bit line driving unit configured to selectively drive a sensing voltage; and a precharging unit disposed between the bit line selecting unit and the bit line driving unit, and configured to precharge an output terminal of the bit line driving unit to the sensing voltage in an interval between the turning-on of the bit line selecting unit and the turning-on of the bit line driving unit.

18. The sensing apparatus of claim 17, wherein the bit line precharging unit comprises;

a switching element configured to selectively couple the bit line selecting unit to the bit line driving unit;

a precharging element disposed between the switching element and the bit line driving unit, and configured to precharge the output terminal of the bit line driving unit to the sensing voltage in an interval between the turning-on of the bit line selecting unit and the turning-on of the bit line driving unit, wherein the switching element and the precharging element are alternately switched and the switching element is turned on at the same time when the bit line driving unit is turned on.

19. The sensing apparatus of claim 17, wherein the output terminal of the bit line driving unit is coupled to the bit line precharging unit and is shared with input terminals of the first sense amplifier and the second sense amplifier.

20. The sensing apparatus of claim 16, wherein the first and second sense amplifiers comprise latch-type differential amplifiers.

21. The sensing apparatus of claim 16, wherein the second sense amplifier is enabled after the first sense amplifier is enabled.

22. The sensing apparatus of claim 16, wherein the first sense amplifier maintains the first output until the second output of the second sense amplifier is generated.

23. The sensing apparatus of claim 16, wherein a level of the first reference voltage is between a level of the second reference voltage and a level of the third reference voltage.

24. The sensing apparatus of claim 16, wherein the reference voltage selector comprises:

a first switching element configured to selectively provide the second reference voltage; and a second switching element configured to selectively provide the third reference voltage, wherein the first and second switching elements sharing an output terminal are alternatively turned on or turned off by the first output.

25. The multi-level sensing apparatus of claim 24, wherein the first and second switching elements comprise transmission gates.

26. The multi-level sensing apparatus of claim 24, wherein the reference voltage selector further comprises a stabilizing unit configured to precharge the shared output terminal of the first and second switching elements.

27. The multi-level sensing apparatus of claim 24, wherein the reference voltage selector further comprises a stabilizing unit comprising a capacitor for a voltage stabilization of the shared output terminal of the first and second switching elements.

28. The multi-level sensing apparatus of claim 24, wherein the reference voltage selector further comprises a stabilizing unit comprising a precharging unit configured to precharge the shared output terminal of the first and second switching elements, and a capacitor for a voltage stabilization of the shared output terminal of the first and second switching elements, which are coupled in parallel to the shared output terminal of the first and second switching elements.

29. A sensing method of a phase change memory, the sensing method comprising:

selecting and precharging a bit line;

driving read data of the bit line after the precharging is completed;

enabling a first sense amplifier to performing a comparison and amplification operation on a first reference voltage and the read data of the bit line to generate a first output;

selecting one of a second reference voltage and a third reference voltage as a fourth reference voltage according to a logic level of the first output;

enabling a second sense amplifier to perform a comparison and amplification operation on the reference voltage and the read data loaded on the bit line to generate a second output; and decoding the first and second outputs to output a sensing data.

30. The sensing method of claim 29, wherein the second sense amplifier is enabled at a time when the first sense amplifier is enabled.

31. The sensing method of claim 29, wherein the first output is maintained until the second output is generated.

32. The sensing method of claim 29, wherein a level of the first reference voltage is between a level of the second reference voltage and a third reference voltage.

33. The sensing method of claim 29, further comprising precharging the output terminal of the fourth reference voltage before the fourth reference voltage is selected.

* * * * *